(12) United States Patent
Glenn

(10) Patent No.: US 6,927,638 B2
(45) Date of Patent: Aug. 9, 2005

(54) PLL WITH MULTIPLE TUNING LOOPS

(75) Inventor: Robert C. Glenn, Bend, OR (US)

(73) Assignee: Intel Corporation, Santa Clara, CA (US)

( * ) Notice: Subject to any disclaimer, the term of this patent is extended or adjusted under 35 U.S.C. 154(b) by 112 days.

(21) Appl. No.: 10/673,803

(22) Filed: Sep. 29, 2003

(65) Prior Publication Data

US 2005/0068112 A1 Mar. 31, 2005

(51) Int. Cl.[7] .................. H03L 7/087; H03L 7/099; H03L 7/18
(52) U.S. Cl. .............. 331/17; 331/11; 331/16; 331/25; 331/36 C; 331/177 R; 331/179; 327/156; 327/157; 455/76; 455/260
(58) Field of Search .............. 331/1 A, 8, 10–12, 331/16–18, 25, 36 C, 177 R, 179; 327/156–159; 332/127; 360/51; 375/376; 455/75, 76, 260

(56) References Cited

U.S. PATENT DOCUMENTS 6,570,421 B1 * 5/2003 Gauthier et al. ............ 327/156

* cited by examiner

*Primary Examiner*—David Mis
(74) *Attorney, Agent, or Firm*—Buckley, Maschoff & Talwalkar LLC

(57) ABSTRACT

Some embodiments provide a charge pump to output a first control signal and a second control signal based on a frequency of an oscillating signal and a reference frequency, a switch capacitor circuit to generate a first output capacitance based on the first control signal, a main loop circuit to generate an output signal based on the second control signal, and an oscillating circuit to generate the oscillating signal, the frequency of the oscillating signal based at least on the first output capacitance and the output signal.

14 Claims, 6 Drawing Sheets

PLL WITH MULTIPLE TUNING LOOPS

CROSS-REFERENCE TO RELATED APPLICATIONS

The present application is related to commonly-assigned and co-pending application Ser. No. 10/675,152, entitled PLL WITH SWAPPABLE TUNING LOOPS, and filed concurrently herewith.

BACKGROUND

A Phase-Locked Loop (PLL) may be used to generate an output signal having a desired frequency, such as a clock signal. A PLL might "lock" to the desired frequency by receiving its output signal via a feedback loop, determining a difference between the output signal and a reference signal, and changing its transfer function in order to reduce the difference.

PLL design often involves trade-offs between tuning range and noise immunity. More specifically, some conventional PLL designs provide a wide range of output frequencies while exhibiting poor noise immunity, while others provide a narrow range of output frequencies while exhibiting good noise immunity. PLL designs that may provide suitable response characteristics within a range of normal operating frequencies are desired.

DETAILED DESCRIPTION

Figure 1:
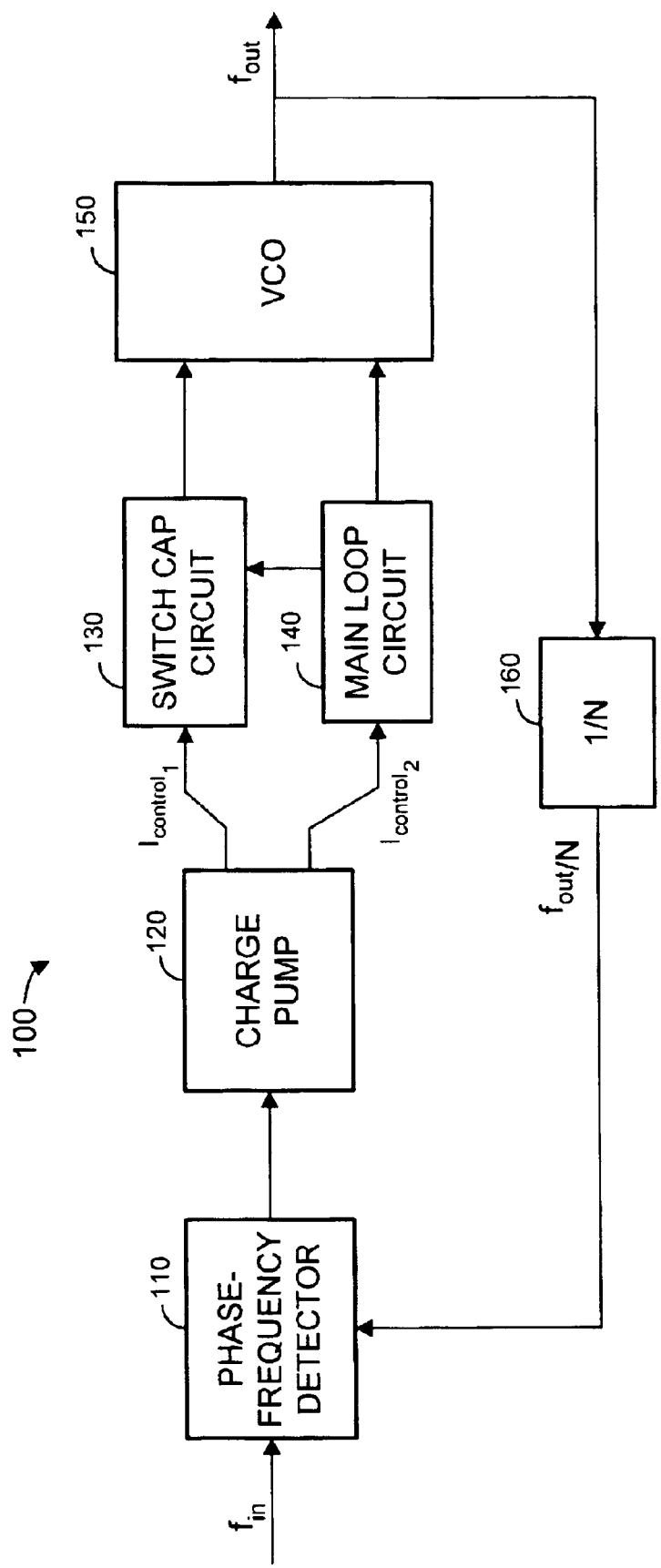
FIG. 1 is a block diagram of a PLL according to some embodiments.

FIG. 1 is a block diagram of PLL 100 according to some embodiments. PLL 100 comprises phase-frequency detector 110, charge pump 120, switch capacitor circuit 130, main loop circuit 140, VCO 150, and feedback divider 160. PLL 100 may generate an oscillating signal $f_{out}$ having a frequency that is based on a reference frequency represented by input signal $f_{in}$. In some embodiments, the reference frequency is equal to the frequency of input signal $f_{in}$, and PLL 100 locks the frequency of $f_{out}$ to $N(f(f_{in}))$.

Generally, according to some embodiments, charge pump 120 outputs a first control signal and a second control signal based on a frequency of an oscillating signal and on a reference signal. Switch capacitor circuit 130 generates an output capacitance based on the first control signal, and main loop circuit 140 generates an output signal based on the second control signal. VCO 150 generates an oscillating signal having a frequency that is based at least on the output capacitance and on the output signal. In some embodiments, phase-frequency detector 110 receives a signal having a first frequency that is based on the frequency of the oscillating signal, receives a reference signal representing the reference frequency, determines a difference between the first frequency and the reference frequency, and transmits a signal to charge pump 120 based on the difference.

Taking each element of PLL 100 in turn, phase-frequency detector 110 receives reference signal $f_{in}$ that represents a reference frequency and receives a signal having a frequency $f(f_{out}/N)$ that is based on the frequency $f(f_{out})$ of the oscillating signal output by VCO 150. In some embodiments, a frequency $f(f_{in})$ of the reference signal $f_{in}$ is equal to the reference frequency. In some embodiments, reference signal $f_{in}$ may otherwise represent the reference frequency, such as by encoding a code that is resolved by detector 110 to arrive at the reference frequency. Similarly, the other signal received by detector 110 may be divided by divider 160 so as to have a frequency that is equal to or a factor of the frequency of the oscillating signal output by VCO 150. According to some embodiments, the other received signal otherwise encodes information indicating the frequency of the oscillating signal.

Detector 110 determines a difference between the two frequencies and transmits a signal to charge pump 120 based on the difference. The difference may be equal to the mathematical difference between the two frequencies or it may be expressed in any other terms that can represent how the two frequencies differ from one another. The terms in which the difference is expressed may depend upon the type of input that is expected by charge pump 120.

In this regard, the signal received by charge pump 120 may indicate the mathematical difference between the two frequencies. The signal may also or alternatively indicate a percentage change required in the frequency of the oscillating signal. In some embodiments, the signal indicates the desired magnitude and/or frequency of control signals $I_{control1}$ and $I_{control2}$.

Charge pump 120 generates control signals $I_{control1}$ and $I_{control2}$ in response to the signal received from detector 110. Accordingly, charge pump 120 generates control signals $I_{control1}$ and $I_{control2}$ based on the frequency of the oscillating signal and on the reference frequency. Charge pump 120 may generate control signals $I_{control1}$ and $I_{control2}$ to source current if $f(f_{out}/N)$ is greater than $f(f_{in})$, and may generate control signals $I_{control1}$ and $I_{control2}$ to sink current if $f(f_{out}/N)$ is greater than $f(f_{in})$.

Control signal $I_{control1}$ is transmitted to switch capacitor circuit 130. Circuit 130 may change its output capacitance based on control signal $I_{control1}$. The output capacitance of switch capacitor circuit contributes to a frequency-controlling capacitance of VCO 150. Accordingly, a frequency of oscillating signal $f_{out}$ may change based on control signal $I_{control1}$ so as to reduce the difference between $f(f_{out}/N)$ and $f(f_{in})$.

Figure 2:
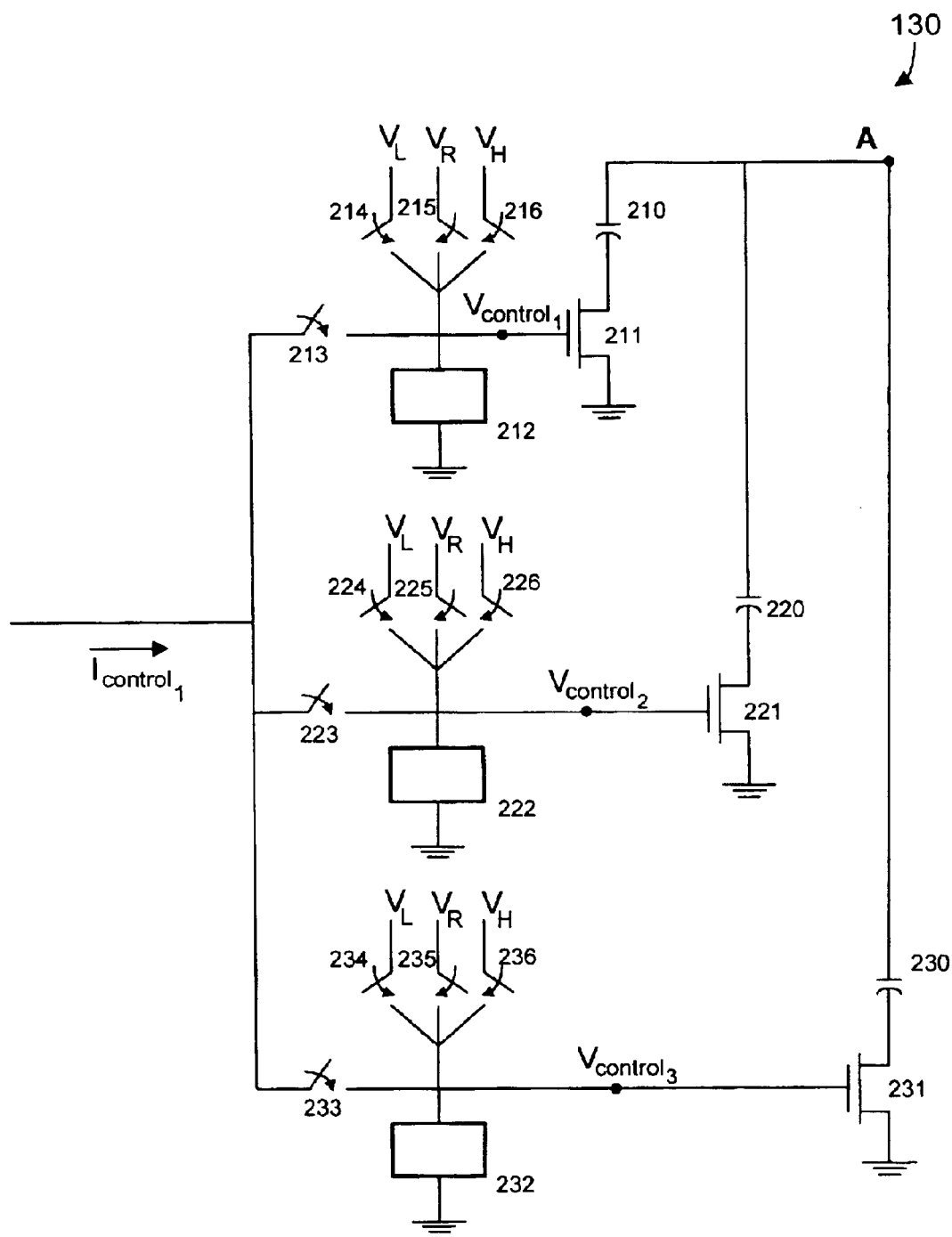
FIG. 2 is a schematic diagram of a switch capacitor circuit according to some embodiments.

Switch capacitor circuit 130 may comprise any circuit for contributing a capacitance to VCO 150 that is based on control signal $I_{control1}$. FIG. 2 is a schematic diagram of circuit 130 according to some embodiments. Circuit 130 of FIG. 2 is described in detail in commonly-owned, co-pending U.S. patent application Ser. No. 10/601,509, entitled SYSTEM TO VARY CAPACITANCE BASED ON A CONTROL SIGNAL and filed on Jun. 23, 2003, the contents of which are incorporated herein by reference. Accordingly, a general description thereof follows below.

Circuit 130 includes capacitors 210, 220 and 230 coupled in parallel. Capacitors 210, 220 and 230 are coupled in series to respective ones of capacitor switches 211, 221 and 231. In a case that one of capacitor switches 211, 221 and 231 is completely "closed" (i.e., its gate voltage results in a minimum drain-to-source resistance), current may flow substantially freely from a respective capacitor to ground. The respective capacitor therefore contributes substantially its entire characteristic capacitance to the total capacitance of capacitors 210, 220 and 230.

One of capacitor switches 211, 221 and 231 is "open" if its gate voltage prevents substantially any current from flowing to ground from a respective capacitor. In such a case, the respective capacitor contributes negligibly to the total capacitance of capacitors 210, 220 and 230. Therefore, as the resistance provided by a capacitor switch decreases, an increased percentage of a respective capacitor's characteristic capacitance is contributed to the total capacitance. In some embodiments, the quality factor ("Q") of the contributed capacitance also increases as the capacitor switch resistance decreases.

The total capacitance may equal the sum at node A of the effective capacitances contributed by each capacitor 210, 220 and 230. The total capacitance is the output capacitance of circuit 130 that is contributed to VCO 150, which is coupled to node A. Since a frequency of an oscillating signal output by VCO 150 is based at least on the output capacitance of circuit 130, the frequency may be changed by changing the total capacitance provided at node A. In some embodiments, the total capacitance provided at node A may be changed without significantly changing the Q of VCO 150.

Capacitor switches 211, 221 and 231 are coupled to respective ones of control circuits 212, 222 and 232. Each of control circuits 212, 222 and 232 may generate a respective control voltage ($V_{control}$), and may set a respective capacitor switch to the generated control voltage.

The respective control voltage determines a source-to-drain resistance of a respective capacitor switch. The control voltage therefore determines an effective capacitance of a respective capacitor that is contributed to the output capacitance at node A. More particularly, the resistance provided by a capacitor switch decreases as its control voltage increases, and, as a result, an increased percentage of its respective capacitor's characteristic capacitance is contributed to the total capacitance.

Each of control circuits 212, 222 and 232 may be coupled to a respective one of control switches 213, 223 and 233. Each of control switches 213, 223 and 233 may couple and decouple a respective control circuit to control signal $I_{control1}$, and control circuits 212, 222 and 232 may generate a respective control voltage based at least on $I_{control1}$.

A set of biasing circuits is coupled to each control circuit 212, 222 and 232 in order to set a respective control voltage to a reset voltage, a first threshold voltage, and a second threshold voltage. For example, biasing circuit 214 may set control voltage $V_{control1}$ to a first threshold voltage $V_L$, biasing circuit 215 may set control voltage $V_{control1}$ to a reset voltage $V_R$, and biasing circuit 216 may set control voltage $V_{control1}$ to a second threshold voltage $V_H$. In the present example, the voltages serve to change a series resistance between capacitor 210 and ground. As described above, a change in the resistance between capacitor 210 and ground changes an amount of the characteristic capacitance of capacitor 210 that is contributed to the output capacitance at node A.

According to some embodiments, the first threshold voltage "opens" capacitor switch 211. The first threshold voltage therefore causes capacitor 210 to contribute negligibly to the output capacitance at node A. The second threshold voltage "closes" capacitor switch 211, resulting in substantially all the characteristic capacitance of capacitor 210 to be contributed to the output capacitance.

The reset voltage may be a voltage that causes capacitor switch 211 to present capacitor 210 with a resistance between 0 and infinity. This resistance may be in the middle of the resistive range of capacitor switch 211. In some embodiments, the first threshold voltage is a voltage at which any further decrease in $V_{control1}$ would not increase a resistance of capacitor switch 211, the second threshold voltage is a voltage at which any further increase in $V_{control1}$ would not decrease a resistance of capacitor switch 211, and the reset voltage is equal to a voltage between the first and second threshold voltages, such as an average of the first and second voltages. Relationships between the biasing circuits coupled to capacitor switches 221 and 231 may be similar to those described with respect to switch 211 and circuits 214 through 216.

In operation, one of control circuits 212, 222 and 232 is uncoupled from its associated biasing circuits and control signal $I_{control1}$ is selectively coupled to only the one control circuit using control switches 213, 223 and 233. The coupled control circuit therefore generates a control voltage $V_{control}$ based on $I_{control1}$, and the control voltage is applied to an associated capacitor switch. A resistance of the capacitor switch may change in response to a change in the control voltage, and the change in resistance may change a capacitance that an associated capacitor contributes to the output capacitance at node A. The capacitance that the associated capacitor contributes to the output capacitance therefore varies based on $I_{control1}$. The capacitor switch is set to the first or second threshold voltage by a biasing circuit once the control voltage reaches either threshold voltage, and the process repeats for another control circuit.

Figure 3:
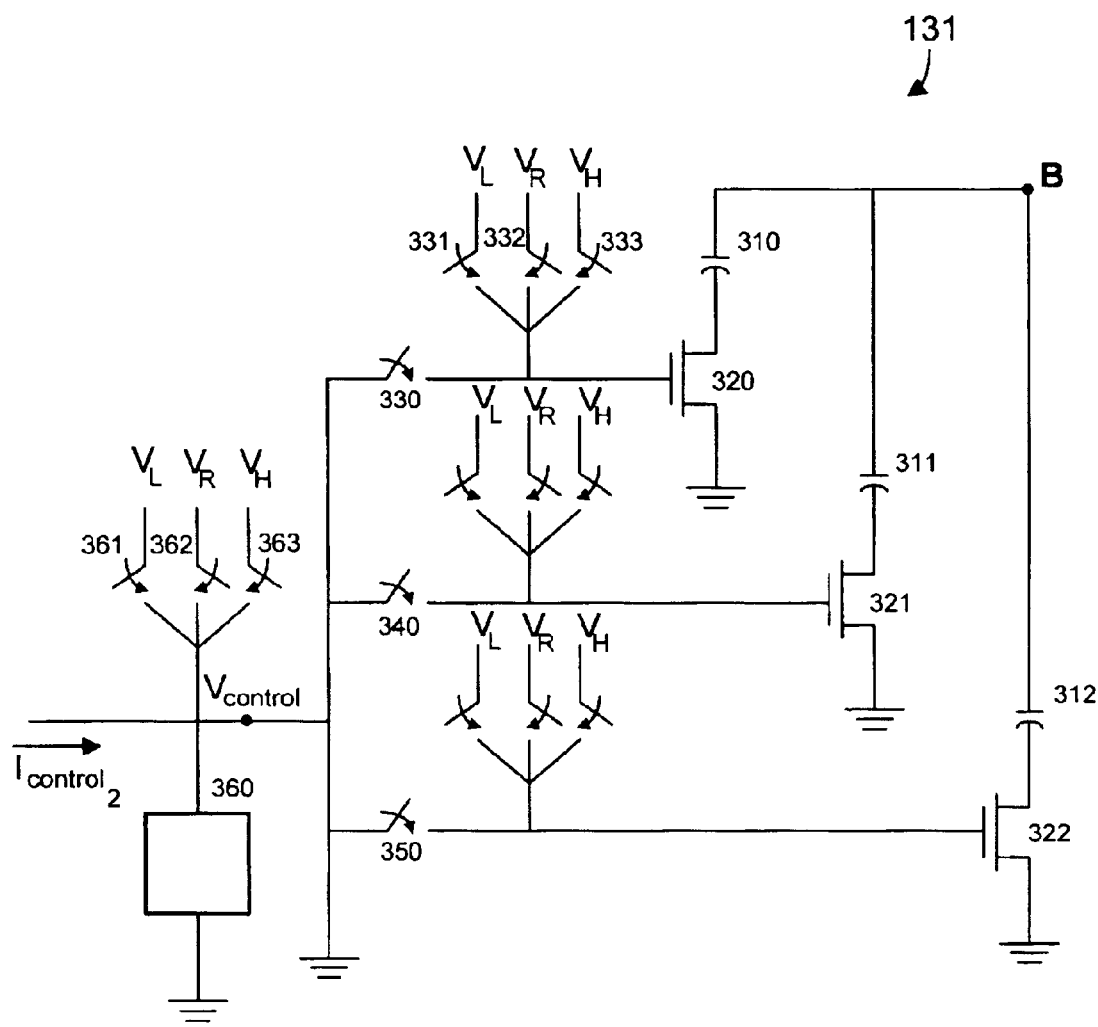
FIG. 3 is a schematic diagram of a switch capacitor circuit according to some embodiments.

FIG. 3 is a schematic diagram of circuit 131 according to some embodiments. Circuit 131 may be substituted for circuit 130 in some embodiments. Circuit 131 is described in detail in commonly-owned, co-pending U.S. patent application Ser. No. 10/601,984, entitled SYSTEM TO VARY CAPACITANCE BASED ON A CONTROL SIGNAL and filed on Jun. 23, 2003, the contents of which are incorporated herein by reference.

Briefly, circuit 131 also includes capacitors 310, 311 and 312 coupled in parallel to each other and coupled in series to respective ones of capacitor switches 320, 321 and 322 as described above. The output capacitance of circuit 131 that is contributed to VCO 150 may equal the sum at node B of the effective capacitances contributed by each capacitor 310, 311 and 312. The frequency of the oscillating signal output by VCO 150 may be changed by changing the total capacitance provided at node B.

Capacitor switches 320, 321 and 322 are respectively coupled to control switches 330, 340 and 350. Control switches 330, 340 and 350 may couple and decouple a respective capacitor switch to a control voltage. Control circuit 360 generates the control voltage ($V_{control}$) based on $I_{control2}$ received from charge pump 120. Control biasing circuits 361, 362 and 363 are coupled to control circuit 360. Biasing circuit 361 may set $V_{control}$ to a first threshold voltage $V_L$, biasing circuit 362 may set $V_{control}$ to a reset voltage $V_R$, and biasing circuit 363 may set $V_{control}$ to a second threshold voltage $V_H$.

During operation, one of capacitor switches 320, 321 and 322 is uncoupled from its associated biasing circuits and is coupled to $V_{control}$ using control switches 330, 340 and 350. Control circuit 360 is also uncoupled from control biasing circuits 361, 362 and 363. Control circuit 360 therefore generates $V_{control}$ based on $I_{control1}$ received from charge pump 120, and $V_{control}$ is applied to the uncoupled capacitor switch. As described above, a resistance of the capacitor switch may change in response to a change in the control voltage, and the change in resistance may change a capacitance that an associated capacitor contributes to the output capacitance at node B. Moreover, the capacitance that the associated capacitor contributes to the output capacitance varies based on $I_{control1}$. The coupled capacitor switch is set to the first or second threshold voltage by a biasing circuit once the control voltage reaches either threshold voltage, and the above process is repeated for another capacitor switch.

Other switch capacitor circuits may be used in conjunction with some embodiments. For example, switch capacitor circuit 130 may "hard switch" capacitors into an output capacitance based on a threshold detect (and reset) on integration.

Control signal $I_{control2}$ is transmitted to main loop circuit 140. Main loop circuit 140 may generate and transmit a voltage signal to VCO 150 in response to control signal $I_{control2}$. Many PLL main loop circuits having this ability are known in the art, and any suitable currently- or hereafter-known main loop circuit may be used in conjunction with some embodiments. VCO 150 may convert the voltage signal to a current signal, which is then used to affect the frequency of the oscillating signal $f_{out}$. Therefore, a frequency of oscillating signal $f_{out}$ may change based on control signal $I_{control2}$.

In some embodiments, main loop circuit 140 is designed to exhibit low gain at low frequencies of operation and high gain at high frequencies of operation, while switch capacitor circuit 130 is designed to exhibit low gain at the high frequencies of operation and low gain at the low frequencies of operation. As a result, switch capacitor circuit 130 may dominate the operation of PLL 100 to bring the output of VCO 150 to the desired frequency, and main loop circuit 140 may dominate the operation to perform high-frequency corrections.

Figure 4:
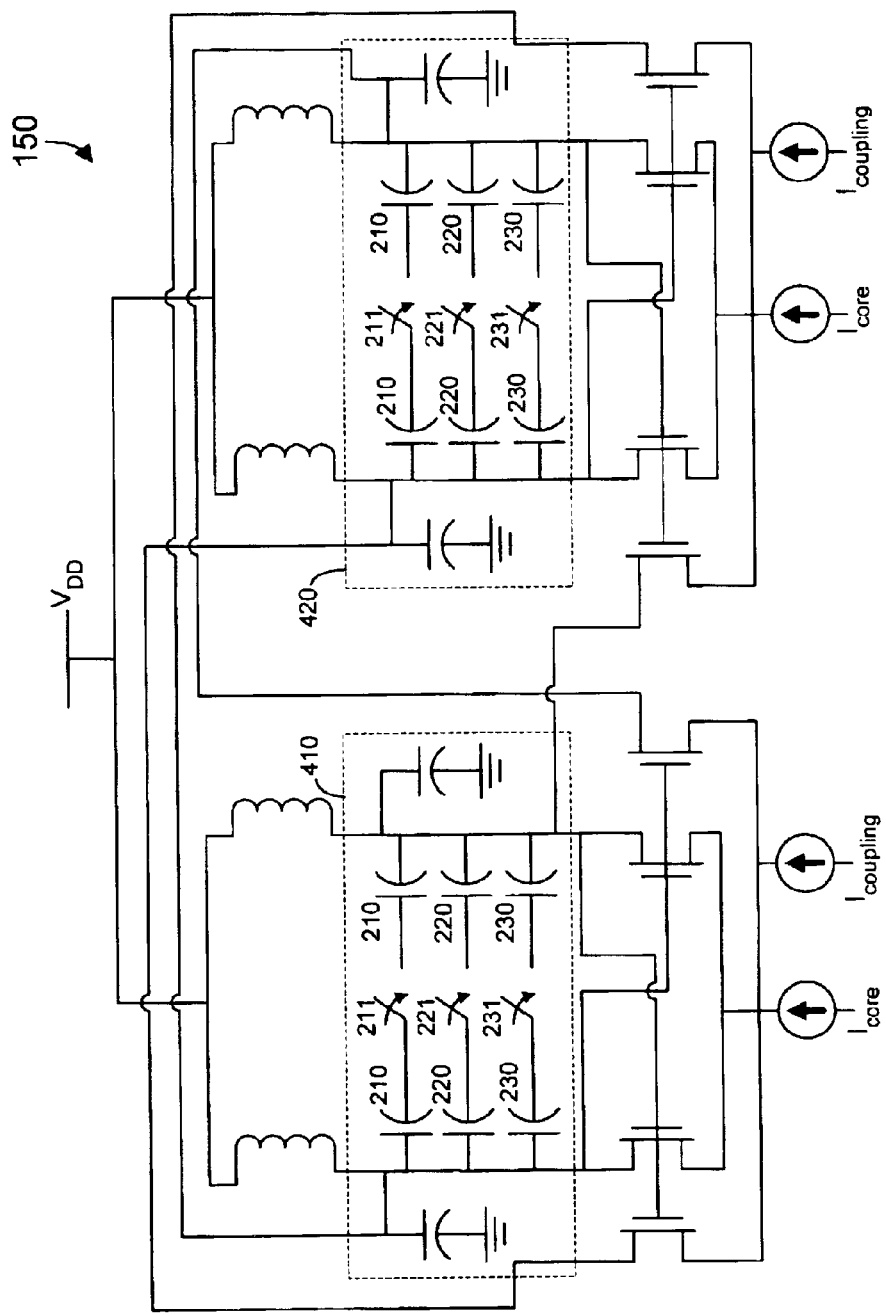
FIG. 4 is a schematic diagram of a VCO according to some embodiments.

FIG. 4 is a schematic diagram of VCO 150 according to some embodiments. VCO 150 outputs signal $f_{out}$ having a frequency based at least on an output capacitance of switch capacitor circuit 130 and on a voltage signal received from main loop circuit 140. VCO 150 of FIG. 4 is a differential-mode LC tank-based VCO known to those of ordinary skill. An output frequency of oscillation of VCO 150 is based at least on output-controlling capacitances 410 and 420. As shown, output-controlling capacitances 410 and 420 include capacitors 210, 220 and 230 and respective capacitor switches 211, 221 and 231 of FIG. 2. In contrast to the single-ended embodiment of FIG. 2, capacitors 210, 220 and 230 are shown in a differential-mode configuration in FIG. 4. As described with respect to FIG. 2, capacitors 210, 220 and 230 of FIG. 4 provide capacitance to VCO 150 based on voltage-controlled series resistances of capacitor switches 211, 221 and 231.

The frequency of $f_{out}$ is also based on $I_{core}$ and $I_{coupling}$. $I_{core}$ and $I_{coupling}$ are received from one or more voltage-to-current converters (not shown) that in turn receive the voltage signal from main loop circuit 140. The voltage signal received from circuit 140 may therefore be a differential signal. As a result, the frequency of $f_{out}$ is also based on the received voltage signal. According to some embodiments, the output frequency of VCO 150 is alternatively or additionally based on a capacitive element such as a varactor or variable capacitor that provides a capacitance based on a voltage signal. Some embodiments may be used in conjunction with any suitable VCO, including but not limited to those based on an RC ring oscillator, an LC tank, an RC tank, and any other type of oscillating circuit.

Figure 5:
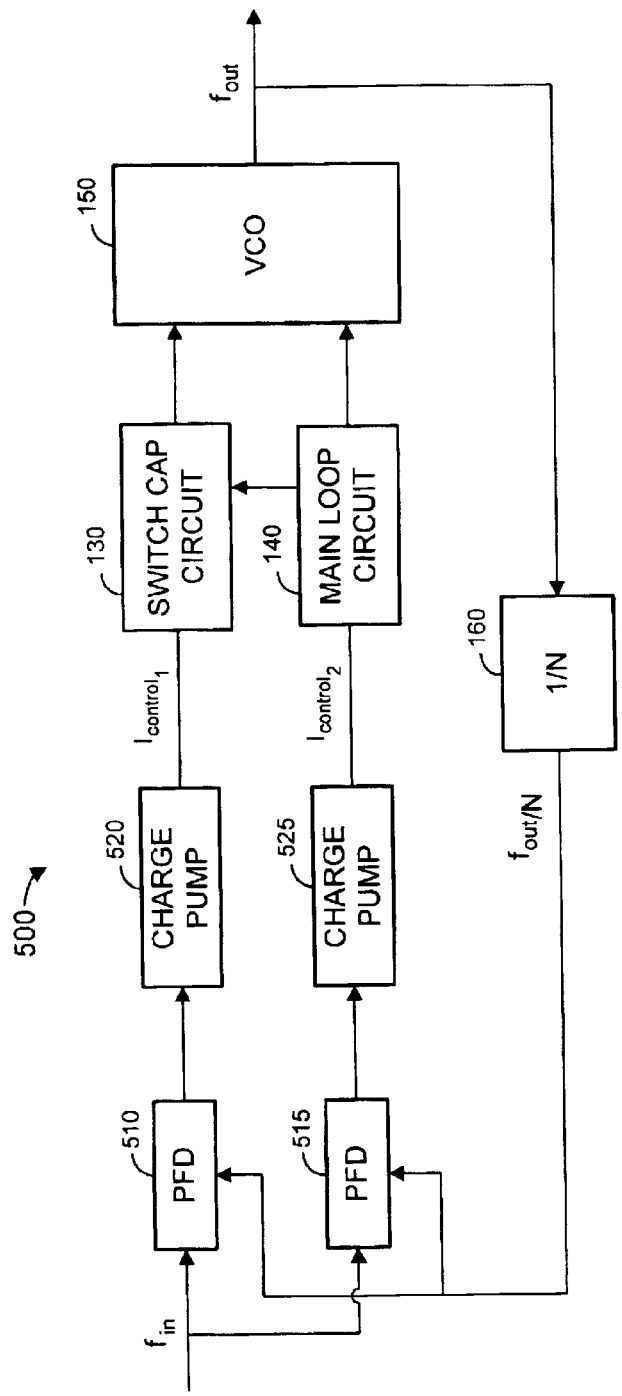
FIG. 5 is a block diagram of a PLL according to some embodiments.

FIG. 5 is a block diagram illustrating PLL 500. PLL 500 includes switch cap circuit 130, main loop circuit 140 and VCO 150 as described above. PLL 500 also includes phase-frequency detector 510, phase-frequency detector 515, charge pump 520, and charge pump 525.

Detector 510 may operate as described above to receive a signal having a first frequency that is based on the frequency of an oscillating signal, receive a reference signal representing a reference frequency, determine a difference between the first frequency and the reference frequency, and transmits a signal to charge pump 520 based on the difference. Charge pump 520 generates and outputs control signal $I_{control1}$ based on the received signal. Accordingly, charge pump 520 outputs control signal $I_{control1}$ based on the frequency of the oscillating signal and on the reference signal.

Similarly, detector 515 may receive the signal having the first frequency, receive the reference signal representing the reference frequency, determine s difference between the first frequency and the reference frequency, and transmits a signal to charge pump 525 based on the difference. In turn, charge pump 525 generates and outputs control signal $I_{control2}$ based on the received signal. Charge pump 525 therefore outputs control signal $I_{control2}$ based on the frequency of the oscillating signal and on the reference signal.

The design of PLL 500 may provide flexibility in the generation of control signals $I_{control1}$ and $I_{control2}$. For example, it may be easier or more efficient to design and operate a system in which distinct elements are used to generate each of $I_{control1}$ and $I_{control2}$. Other embodiments may provide a single frequency-phase detector that transmits signals to charge pump 520 and charge pump 525. The signals transmitted by the single frequency-phase detector may be identical to or different from one another.

Figure 6:
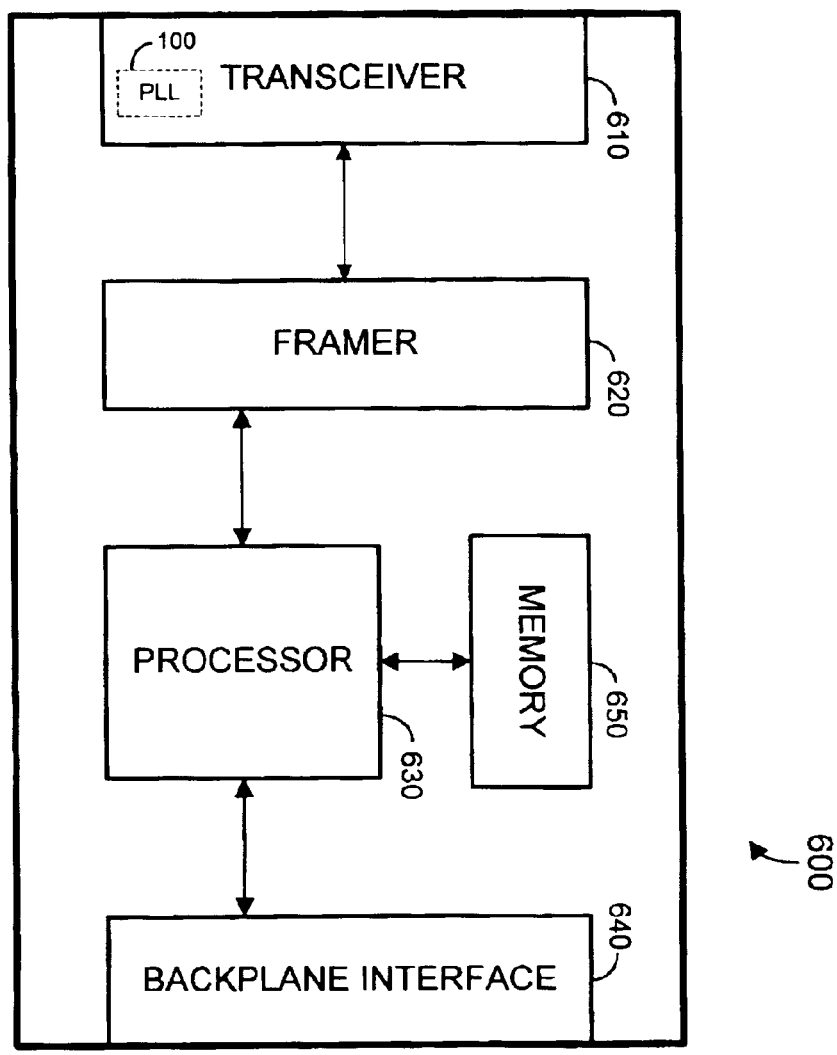
FIG. 6 is a block diagram of a line card according to some embodiments.

FIG. 6 is a block diagram of line card 600 according to some embodiments. Line card 600 may provide an interface between a main backplane and an optical network. Line card 600 may comprise a circuit board onto which the illustrated elements are mounted. The elements include transceiver 610, framer 620, processor 630, backplane interface 640, and memory 650.

Transceiver 610 may be an optical transceiver including elements for transmitting and receiving data over an optical physical layer. A transmitting section of transceiver 610 may comprise PLL 100 of FIG. 1. A receiving section may include a Clock and Data Recovery Unit that also incorporates PLL 100. Transceiver 610 may also comprise a serial/deserializer to process outgoing/incoming data.

Framer 620 may receive and decapsulate encapsulated data that is received by the receiving section of transceiver 610. Framer 620 may also encapsulate data received from processor 630 prior to transmitting the encapsulated to transceiver 620. Processor 630 receives/transmits data from/to backplane interface 640, which communicates with a network server or a network switch backplane. Memory 650 is in communication with processor 630 and may comprise a Double Data rate Random Access Memory, a Quad Data rate Random Access Memory, or any other suitable memory. Memory 650 may store program code executable by processor 630 and/or other data for use by processor 630.

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

What is claimed is:

1. An apparatus comprising:

a charge pump to output a first control signal and a second control signal based on a frequency of an oscillating signal and a reference frequency;

a switch capacitor circuit to generate a first output capacitance based on the first control signal;

a main loop circuit to generate an output signal based on the second control signal; and an oscillating circuit to generate the oscillating signal, the frequency of the oscillating signal based at least on the first output capacitance and the output signal.

2. An apparatus according to claim 1, the switch capacitor circuit to exhibit more gain at first frequencies of operation than at second frequencies of operation, the second frequencies being greater than the first frequencies, and the main loop circuit to exhibit less gain at the first frequencies of operation than at the second frequencies of operation.

3. An apparatus according to claim 1, further comprising:

a detector to receive a signal having a first frequency, the first frequency based on the frequency of the oscillating signal, to receive a reference signal representing the reference frequency, to determine a difference between the first frequency and the reference frequency, and to transmit a signal to the charge pump based on the difference.

4. An apparatus according to claim 3, wherein the first frequency is equal to the frequency of the oscillating signal.

5. An apparatus according to claim 3, wherein the first frequency is a factor of the frequency of the oscillating signal.

6. An apparatus comprising:

a first charge pump to output a first control signal based on a frequency of an oscillating signal and a reference frequency;

a second charge pump to output a second control signal based on the frequency of an oscillating signal and the reference frequency;

a switch capacitor circuit to generate a first output capacitance based on the first control signal;

a main loop circuit to generate an output signal based on the second control signal; and an oscillating circuit to generate the oscillating signal, the frequency of the oscillating signal based at least on the first output capacitance and the output signal.

7. An apparatus according to claim 6, the switch capacitor circuit to exhibit more gain at first frequencies of operation than at second frequencies of operation, the second frequencies being greater than the first frequencies, and the main loop circuit to exhibit less gain at the first frequencies of operation than at the second frequencies of operation.

8. An apparatus according to claim 6, further comprising:

a first detector to receive a signal having a first frequency, the first frequency based on the frequency of the oscillating signal, to receive a reference signal representing the reference frequency, to determine a first difference between the first frequency and the reference frequency, and to transmit a first detector signal to the first charge pump based on the first difference; and a second detector to receive the signal having the first frequency, to receive the reference signal, to determine a second difference between the first frequency and the reference frequency, and to transmit a second detector signal to the second charge pump based on the second difference.

9. An apparatus according to claim 8, wherein the first frequency is equal to the frequency of the oscillating signal.

10. An apparatus according to claim 8, wherein the first frequency is a factor of the frequency of the oscillating signal.

11. A system comprising:

a transceiver to transmit and receive data comprising:

a charge pump to output a first control signal and a second control signal based on a frequency of an oscillating signal and a reference frequency;

a switch capacitor circuit to generate a first output capacitance based on the first control signal;

a main loop circuit to generate an output signal based on the second control signal; and an oscillating circuit to generate the oscillating signal, the frequency of the oscillating signal based at least on the first output capacitance and the output signal, the oscillating signal to be used to encode and decode the data;

a processor to process the data; and a double data rate memory in communication with the processor.

12. A system according to claim 11, the switch capacitor circuit to exhibit more gain at first frequencies of operation than at second frequencies of operation, the second frequencies being greater than the first frequencies, and the main loop circuit to exhibit less gain at the first frequencies of operation than at the second frequencies of operation.

13. A system according to claim 11, further comprising:

a detector to receive a signal having a first frequency, the first frequency based on the frequency of the oscillating signal, to receive a reference signal representing the reference frequency, to determine a difference between the first frequency and the reference frequency, and to transmit a signal to the charge pump based on the difference.

14. A system according to claim 11, further comprising:

a framer coupled to the transceiver and to the processor, the framer to decapsulate data received by the transceiver and to encapsulate data to be transmitted by the transceiver.

* * * * *